United States Patent [19]

Weinberger et al.

[11] 4,102,686

[45] Jul. 25, 1978

[54] LITHOGRAPHIC PHOTOSENSITIVE COMPOSITIONS COMPRISING ACRYLONITRILE-BUTADIENE-STYRENE TERPOLYMER AND NOVOLAK RESIN

[75] Inventors: Lester Weinberger, Riverdale; Robin Daskin, Levittown, both of N.Y.

[73] Assignee: Polychrome Corporation, Yonkers, N.Y.

[21] Appl. No.: 772,054

[22] Filed: Feb. 25, 1977

[51] Int. Cl.$^2$ .................................. G03C 1/52
[52] U.S. Cl. ................................ 96/91 R; 96/86 P; 96/115 R; 96/91 D
[58] Field of Search ............... 96/91 R, 91 D, 115 R, 96/35, 86 P; 260/846

[56] References Cited

U.S. PATENT DOCUMENTS

| | | | |
|---|---|---|---|
| 3,264,104 | 8/1966 | Reichel | 96/91 D |
| 3,402,044 | 9/1968 | Steinhoff et al. | 96/91 D |
| 3,787,212 | 1/1974 | Heimsch et al. | 96/35.1 |
| 3,944,510 | 3/1976 | Bowers et al. | 260/846 |

*Primary Examiner*—John D. Welsh

[57] ABSTRACT

The reaction product formed by the addition of a phenol-formaldehyde to an acrylonitrile-butadiene-styrene terpolymer has incorporated therein a suitable photosensitizer to form a composition which when coated on an appropriate substrate alternately may form an unusually durable photoresist or a long running offset plate.

13 Claims, No Drawings

LITHOGRAPHIC PHOTOSENSITIVE COMPOSITIONS COMPRISING ACRYLONITRILE-BUTADIENE-STYRENE TERPOLYMER AND NOVOLAK RESIN

BACKGROUND OF THE INVENTION

This invention relates to improved photoresists and lithographic printing plates. More particularly, this invention relates to a novel photosensitive composition useful in the production of photoresists and lithographic printing plates. Still more particularly, this invention relates to an improved photoresist and lithographic printing plate which employs novel photosensitive compositions which display unusually durable properties.

While the prior art discloses a plethora of photosensitive compositions useful for photoresist and lithographic purposes, their serviceability is limited by the physical strength of the composition. The present invention substantially augments the strength and hence the useful lifetime of the lithographic image with a concomitant significant increase in the number of satisfactory printing impressions possible before image deterioration.

DESCRIPTION OF THE PRIOR ART

Combinations of acrylonitrile-butadiene-styrene terpolymer (ABS) and phenol-formaldehyde (novolak) resins have been described in U.S. Pat. No. 3,944,510. These prior art uses have been limited to applications such as shell process foundry resins to increase resistance to peelback. However, heretofore, no application of this composition for photographic arts has been developed or suggested.

SUMMARY OF THE INVENTION

This invention relates to novel photosensitive coatings suitable for the manufacture of extremely durable photoresists and lithographic printing plates. The compositions of this invention are prepared by the incorporation of a suitable photosensitizing agent in the reaction product obtained from the synthesis of a suitable ABS-novolak resin.

It is, therefore, an object of the present invention to provide improved photosensitive compositions suitable for forming an image on a suitable base.

It is another object of the invention to provide compositions for coating on lithographic plates which form an improved and longer running plate.

It is still another object of the instant invention to provide more durable photoresists.

It is a further object of the present invention to provide wear resistant image forming surfaces on suitable substrates.

It is still further object of the invention to provide an improved lithographic printing plate which is stable to ordinary ambient heat and humidity conditions for protracted storage.

These and other objects of this invention will be in part discussed and in part apparent upon examination of the detailed description of the preferred embodiment.

DETAILED DESCRIPTION OF THE PREFERRED EMBODIMENT

It has now been found that acrylonitrile-butadiene-styrene (ABS)-novolak resins having incorporated therein a suitable photosensitive agent can be produced, having the distinct advantage over prior art compositions of substantially increasing the durability of the imaged printing surface when they are employed in lithographic printing plates. More particularly, we have now found that when a suitable ABS-novolak resin composition has incorporated therein a suitable photosensitizing agent, the resultant composition may be coated upon a suitable substrate, for example, aluminum foil or sheets, for use as a lithographic printing plate.

The acrylonitrile-butadiene-styrene terpolymer which may be employed in the practice of this invention, is not limited by its molecular weight. We have found that ABS terpolymers which are well known to the skilled worker, and which have a molecular weight of from about 150,000 to about 180,000 may be suitably employed in the practice of this invention; however, most satisfactory results are obtained when the ABS terpolymer employed herein has a weight average molecular weight of from 160,000 to 17,000, for example, those ABS terpolymers which are commercially available under the tradenames of Dow 300 and Dow 500, Dow Chemical Company, U.S.A., and Goodyear's Abson 820 × 15.

The ABS terpolymer employable in the practice of this invention is then reacted or admixed with a suitable novolak resin. The novolak resins utilized in the practice of this invention are known in the art, for example as disclosed in U.S. Pat. No. 3,923,522. However, in the preferred embodiment of this invention, the novolak resin which may be employed in this invention is the reaction product of a phenol and formaldehyde, for example, cresol, bisphenol, paraformaldehyde, and oxalic acid. Most preferably, the novolak resin may be prepared by the reaction of a phenol, such as m-cresol or bisphenol A, with a formaldehyde such as, paraformaldehyde, catalyzed by oxalic acid although other reactants also provide satisfactory results.

In the practice of this invention, we have found that most satisfactory results are obtained when the ABS-novolak resin composition is first prepared and the suitable photosensitizing agent is subsequently incorporated therein. The ABS-novolak resin composition is satisfactorily prepared by the simultaneous reaction of the phenol and formaldehyde to form the novolak resin, in the presence of the desired ABS terpolymer. In other words, the reaction of the desired phenol, for example, m-cresol and the desired formaldehyde for example, paraformaldehyde, is carried out in the presence of the desired ABS terpolymer, for example, Dow ABS terpolymer 300, so that the resultant product is the desired admixed ABS-novolak composition.

Into this resultant ABS-novolak composition is then incorporated the desired photosensitive agent to yield the novel photosensitive coating composition of this invention. The photosensitive agents which may be satisfactorily employed in the practice of this invention are those which are lithographically suitable and are actinic and ultraviolet light reactive. The photosensitive agents which may be employed in the practice of this invention are those which are negative or positive acting and include such negative acting photosensitive agents as, the azidopyrenes, for example, 1-azidopyrene, 6-nitro-1-azidopyrene, 1,6-diazidopyrene, 1,8-diazidopyrene, 1-propionyl-6-azidopyrene, 1-acetyl-6-azidopyrene, 1-n-butyryl-6-azidopyrene, 1-n-propionyl-8-bromo-6-azidopyrene, 6-n-propionyl-1-azidopyrene-8-sulfonic acid and 8-n-propionyl-1,6-diazidopyrene; and such positive acting photosensitive agents as aromatic diazo-oxide compounds, for example, benzoquinone diazides, naphthoquinone diazides, and polyacetals which depolymerize under ultraviolet radiation, polymonochloroacetaldehyde, polypropionaldehyde, poly-n-butyraldehyde, poly-cyanoacetaldehyde, poly-B-cyanopropionaldehyde poly-isobutyraldehyde, poly-valeraldehyde, poly-heptaldehyde. The most satisfactory photosensitive agent may be selected by the skilled worker, depending upon the results sought to be achieved.

It has also been found in the practice of this invention that satisfactory results are obtained when the ABS terpolymer is present in the ABS-novolak resin composition in an amount equal to from 1% to 7% by weight and most preferably from 3% to 5% by weight. The photosensitive agent may be present in the final composition of this invention in an amount of from 20% to about 70% and preferably from about 30% to about 35%, to yield satisfactory results.

The optimum proportion of each ingredient and selection of particular composition naturally depends on the specific properties desired in the final lithographic plate or photoresist.

The composition of this invention may henceforth be applied to a suitable substrate such as a metal sheet, for example, aluminum, or silicon. Before applying the product of this disclosure to such a suitable base, the base may be treated in a variety of ways known to the art to enhance the character of the surface. For example, an aluminum substrate may be mechanically or chemically grained or etched, anodized to enable better bonding to the coating and resistance to abrasion and wear, or a protective or binding interlayer may be imposed between the base and the coating. The amount of the reaction product coating composition, and thus the thickness of the ultimate image or object area on the article or plate, varies.

Coating thickness depends mainly on the concentration of the coating solution and the mechanical means by which it is applied to base sheets. For example, in a continuous process wherein a roll of sheet aluminum is passed through a coating tank, there must be taken into account for each particular system the speed of the web, the tank length, subsequent drying time and temperature, and solvent volatility.

Too small an amount results in too little material in the object or image area. Hence less than the prolonged durability and press life otherwise attainable is achieved. Too much of the composition, however, results in thick coatings that are more difficult to develop and into which the penetration of light during exposure either is insufficient or requires an unnecessarily long time, especially considered from a commercial standpoint. Coating thickness of from 2 to 20 mils is preferred.

The following examples are presented to demonstrate the production of the composition of the instant invention although they in no way limit the scope of the disclosure.

EXAMPLE I

To 108.1g (1 mole) m-cresol was added 8.5g ABS terpolymer (Dow 300 resin; Dow Chemical, U.S.A.) in 20 ml. xylene. The mixture was vigorously stirred and heated to 120° C for 40 minutes. The mixture was cooled to 52° C and 22.8g bisphenol A (0.1 mole), 36g 91% paraformaldehyde (1.09 mole), and 4g oxalic acid was added. The mixture was heated to 73° C at which time the temperature spontaneously rose to 112° C over a 2 minute period. Heating was continued for 12 minutes; the xylene was removed by filtration and a white product was obtained.

EXAMPLE II

Example I was followed substituting 17g ABS terpolymer 500 (Dow Chemical Co.) for the Dow 300 ABS terpolymer. The resulting resin was similar to Example I.

EXAMPLE III

Comparable results were obtained substituting 5.1g of Goodyear's Abson 820 × 15 ABS terpolymer for the Dow 300 ABS terpolymer.

EXAMPLE IV

A positive working photosensitizing agent for a lithographic plate was prepared by blending 20 ml. ethyl cellosolve, 20 ml. methyl ethyl ketone, 30 ml. amyl acetate, 30 ml. methyl isobutyl ketone, 5.89g of the resin prepared according to Example I, 0.18g Calco oil blue, and 1.93g of a sensitizer formed as the ester between pyrogallol acetone polymer and 1-oxo-2-diazonaphthalene-5-sulfonic acid as described in U.S. Pat. No. 3,635,709. The mixture was whirlcoated onto an aluminum substrate at 80 RPM and 80° C. The plates were exposed to a conventional 5KW metal halide lamp at a distance of 1 meter for 40 seconds. The plate was developed with Polychrome's alkaline 985 developer and a printing press life test performed using the thus prepared lithographic plate.

Comparative studies were performed substituting other commercially available novolak resin photosensitizers on lithographically suitable aluminum substrates. The following results were noticed.

| Composition | Number of Impressions | Resolution | Plate Background |
| --- | --- | --- | --- |
| ABS-novolak | 137,000 | Excellent | Clean |
| Bakelite 2620 | 118,000 | Good | Clean |
| Alnoval-American Hoechst PN-430 | 94,000 | Fair | Slightly dirty |
| Reichold Vacuum | 68,000 | Poor | Dirty |

These press tests show the marked superiority of the ABS-novolak resins in terms of resolution, solid area coverage, plate cleanliness and length of run. Superior shelf life has also been demonstrated.

EXAMPLE V

A negative working lithographic plate was prepared as follows:

While under yellow lighting conditions, 2.9g of ABS-novolak was added to a solvent system consisting of 40ml. methyl ethyl ketone, 40 ml. ethyl cellosolve, 60 ml. methyl isobutyl ketone and 60 ml. amyl acetate and stirred for 1.5 hour. Then, 1.6g of 1-azidopyrene was added to the mixture and stirring was continued for 0.5 hour. The solution was then filtered and coated on 10 × 10 inches grained, anodized aluminum plates. These plates thus formed were exposed through a partially masked transparency to ultraviolet light for 75, 150 and 300 seconds respectively and developed using 200 ml. of Polychrome's 922 developer for a 20 second dwell time and a 30 second rub time before rinsing with water. Each such plate demonstrated a clean image which had excellent ink affinity on its exposed portions and sharp image in masked areas.

It is of course to be understood that the foregoing disclosure is intended to illustrate the invention and that numerous changes can be made in the ingredients, conditions and proportions set forth without departing from the scope of the invention as disclosed and defined in the claims appended hereafter.

We claim:

1. A photosensitive composition which comprises the mixture of an acrylonitrile-butadiene-styrene terpolymer with a novolak resin and a lithographically suitable photosensitizer wherein the proportion of acrylonitrile-butadiene-styrene terpolymer in the blend of the acrylonitrile-butadiene-styrene terpolymer with the novolak resin is in the range of from 1% to 7% by weight and wherein the proportion of photosensitizer in the mixture of the photosensitizer with the acrylonitrile-butadiene-styrene blend with said novolak resin is in the range of from 20% to 70%.

2. The photosensitive composition of claim 1 wherein the novolak resin is a composition which is the reaction product of m-cresol, bis-phenol A, paraformaldehyde and oxalic acid.

3. The photosensitive composition of claim 1 wherein the photosensitizer is a composition selected from the group consisting of aromatic diazo compounds, azidopyrenes, benzoquinone diazides, naphthoquinone diazides, polyacetals which depolymerize under ultraviolet radiation, polymonochloroacetaldehyde, polypropionaldehyde, poly-n-butyraldehyde, poly-cyanoacetaldehyde, poly-B-cyanopropionaldehyde, poly-cyanopentaldehyde, polycyanovaleraldehyde, poly-n-butyraldehyde, poly-isobutyraldehyde, polyvaleraldehyde and polyheptaldehyde.

4. A lithographic printing plate which comprises a metal sheet substrate having coated thereon a photosensitive composition which comprises the mixture of an acrylonitrile-butadiene-styrene terpolymer with a novolak resin and a lithographically suitable photosensitizer wherein the proportion of acrylonitrile-butadiene-styrene terpolymer in the blend of the acrylonitrile-butadiene-styrene terpolymer with the novolak resin is in the range of from 1% to 7% by weight and wherein the proportion of photosensitizer in the mixture of the photosensitizer with the acrylonitrile-butadiene-styrene blend with said novolak resin is in the range of from 20% to 70%.

5. The lithographic printing plate of claim 4 wherein the novolak resin is a composition which is the reaction product of m-cresol, bis-phenol A, paraformaldehyde and oxalic acid.

6. The lithographic printing plate of claim 4 wherein the photosensitizer is a composition selected from the group consisting of aromatic diazo compounds, azidopyrenes, benzoquinone diazides, naphthoquinone diazides, polyacetals which depolymerize under ultraviolet radiation, polymonochloroacetaldehyde, polypropionaldehyde, poly-n-butyraldehyde, poly-cyanopentaldehyde, polycyanovaleraldehyde, poly-n-butyraldehyde, poly-isobutyraldehyde, poly-valeraldehyde and polyheptaldehyde.

7. The lithographic printing plate of claim 4 where the metal sheet substrate is comprised of aluminum.

8. The lithographic printing plate of claim 7 where the aluminum substrate has been anodized.

9. The lithograhic printing plate of claim 7 where the aluminum has been grained.

10. The lithographic printing plate of claim 9 where the grained aluminum substrate has been anodized.

11. A photoresist which comprises a suitable substrate having coated thereon a photosensitive composition which comprises the mixture of an acrylonitrile-butadiene-styrene terpolymer with a novolak resin and a lithographically suitable photosensitizer wherein the proportion of acrylonitrile-butadiene-styrene terpolymer in the blend of the acrylonitrile-butadiene-styrene terpolymer with the novolak resin is in the range of from 1% to 7% by weight and wherein the proportion of photosensitizer in the mixture of the photosensitizer with the acrylonitrile-butadiene-styrene blend with said novolak resin is in the range of from 20% to 70%.

12. The photoresist of claim 11 wherein the novolak resin is a composition which is the reaction product of m-cresol, bis-phenol A, paraformaldehyde and oxalic acid.

13. The photoresist of claim 11 wherein the photosensitizer is a composition selected from the group consisting of aromatic diazo compounds, azidopyrenes, benzoquinone diazides, naphthoquinone diazides, polyacetals which depolymerize under altraviolet radiation, polymonochloroacetaldehyde, polypropionaldehyde, poly-n-butyraldehyde, poly-cyanoacetaldehyde, poly-B-cyano-propionaldehyde, polycyanopentaldehyde, polycyano-valeraldehyde, poly-n-butyraldehyde, poly-isobutyraldehyde, poly-valeraldehyde and polyheptaldehyde.

* * * * *

UNITED STATES PATENT OFFICE
CERTIFICATE OF CORRECTION

Patent No. 4,102,686                     Dated July 25, 1978

Inventor(s) Lester Weinberger et al.

It is certified that error appears in the above-identified patent and that said Letters Patent are hereby corrected as shown below:

Column 2, line 19, "17,000" should read --- 170,000 ---.

Signed and Sealed this

Thirteenth Day of February 1979

[SEAL]

Attest:

RUTH C. MASON
Attesting Officer

DONALD W. BANNER
Commissioner of Patents and Trademarks